United States Patent
Kim et al.

(10) Patent No.: US 8,648,342 B2
(45) Date of Patent: Feb. 11, 2014

(54) WAVEGUIDE-INTEGRATED GRAPHENE PHOTODETECTORS

(71) Applicant: Samsung Electronics Co., Ltd., Suwon-Si (KR)

(72) Inventors: Taek Kim, Seongnam-si (KR); Bok-ki Min, Suwon-si (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 0 days.

(21) Appl. No.: 13/644,102

(22) Filed: Oct. 3, 2012

(65) Prior Publication Data

US 2013/0105795 A1    May 2, 2013

(30) Foreign Application Priority Data

Nov. 2, 2011 (KR) ........................ 10-2011-0113584

(51) Int. Cl.
*H01L 31/0312* (2006.01)

(52) U.S. Cl.
USPC .................. 257/49; 257/29; 257/39; 257/76; 257/E21.121

(58) Field of Classification Search
USPC .................. 257/29, 39, 76, 432, E21.121
See application file for complete search history.

(56) References Cited

U.S. PATENT DOCUMENTS

| | | | |
|---|---|---|---|
| 2010/0158445 A1* | 6/2010 | Kim et al. | 385/53 |
| 2010/0200839 A1 | 8/2010 | Okai et al. | |
| 2011/0042650 A1 | 2/2011 | Avouris et al. | |
| 2011/0108805 A1 | 5/2011 | Okai | |
| 2013/0105795 A1* | 5/2013 | Kim et al. | 257/49 |

FOREIGN PATENT DOCUMENTS

| | | |
|---|---|---|
| JP | 2009-210265 | 9/2009 |
| JP | 2010-015121 | 1/2010 |
| JP | 2010021377 A | 1/2010 |
| JP | 2010-153793 A | 7/2010 |
| KR | 20110020443 A | 3/2011 |

OTHER PUBLICATIONS

Mueller, et al., "Graphene photodectors for high-speed optical communications", Nature Photonics, vol. 4, May 2010, pp. 297-301.
Xia, et al., "Ultrafast graphene photodetector", Nature Nanotechnology, vol. 4, Dec. 2009, pp. 839-843.

* cited by examiner

*Primary Examiner* — Dung A. Le
(74) *Attorney, Agent, or Firm* — Harness, Dickey & Pierce, P.L.C.

(57) ABSTRACT

A photodetector includes a waveguide on a substrate, and a photodetection portion connected to the waveguide. The photodetection portion includes a first semiconductor layer, graphene on the semiconductor layer, and a second semiconductor layer on the graphene. A first electrode and a second electrode separated from the first ridge portion and electrically connected to the graphene.

37 Claims, 7 Drawing Sheets

WAVEGUIDE-INTEGRATED GRAPHENE PHOTODETECTORS

CROSS-REFERENCE TO RELATED APPLICATIONS

This application claims priority under 35 U.S.C. §119 to Korean Patent Application No. 10-2011-0113584, filed on Nov. 2, 2011, in the Korean Intellectual Property Office, the disclosure of which is incorporated herein in its entirety by reference.

BACKGROUND

1. Field

Example embodiments relate to waveguide-integrated graphene photodetectors including photodetectors connected (e.g., directly connected) to a waveguide and graphene formed at a central portion of the photodetector.

2. Description of the Related Art

Photodetectors are apparatuses for generating electrical signals by detecting light intensity. As data processing speed has increased, an interconnection bandwidth for transmitting data has also gradually increased. Accordingly, optical interconnections capable of transmitting a larger amount of data using lower power than electrical interconnections may be desirable.

When using an optical interconnection, data is transmitted by modulating a laser beam at relatively high speeds. Thus, high speed operation of a photodetector for converting data back into an electric signal needs to be supported.

In a photodetector manufactured of a germanium (Ge) or group III-V compound semiconductor, a transmission speed is limited to about 40-50 Gbps because the speed at which a carrier generated by receiving light moves to an electrode is limited. Graphene, however, has relatively high carrier mobility, and may operate at about 1.5 THz.

SUMMARY

Waveguide-integrated graphene photodetectors according to at least some example embodiments provide optical interconnection enabling higher speed operation by forming a photodetector in contact with (e.g., directly in contact with) a waveguide and graphene in the photodetector so as to move electrons using the graphene.

Additional aspects will be set forth in part in the description which follows and, in part, will be apparent from the description, or may be learned by practice of the presented example embodiments.

At least one example embodiment provides a waveguide-integrated graphene photodetector. According to at least this example embodiment, the waveguide-integrated graphene photodetector includes: a waveguide on a substrate, and a photodetection portion connected to the waveguide and through which light from the waveguide passes. The photodetection portion includes a first ridge portion extending from an underpart of the waveguide, graphene formed on at least an upper surface of the first ridge portion, a second ridge portion formed on the graphene to face the first ridge portion, and a first electrode and a second electrode separated from the first ridge portion and electrically connected to the graphene. The second ridge portion contacts an upperpart of the waveguide.

At least one other example embodiment provides a photodetector. According to at least this example embodiment, the photodetector includes: a waveguide on a substrate; and a photodetection portion configured to receive light incident on the waveguide. The photodetection portion includes: a first semiconductor layer contacting the waveguide; graphene on the first semiconductor layer; and a second semiconductor layer on the graphene.

At least one other example embodiment provides a waveguide-integrated graphene photodetector. According to at least this example embodiment, a waveguide-integrated graphene photodetector includes: a waveguide on a substrate, and a photodetection portion connected to the waveguide and through which light from the waveguide passes. The photodetection portion includes: a first ridge portion extended from the waveguide, a second ridge portion formed to face the first ridge portion, graphene between the first and second ridge portions, and a first electrode and a second electrode separated from the first ridge portion and electrically connected to the graphene.

According to at least some example embodiments, the photodetection portion may be connected to the waveguide, the first semiconductor layer may have a first ridge portion extending from a lower portion of the waveguide, the graphene may be formed on at least an upper surface of the first ridge portion, and the second semiconductor layer may include a second ridge portion formed on the graphene. The second ridge portion may contact an upper portion of the waveguide. The photodetector may further include: a first electrode and a second electrode separated from the first ridge portion and electrically connected to the graphene.

According to at least some other example embodiments, the photodetection portion may be connected to the waveguide, the first semiconductor layer may include a first ridge portion extended from the waveguide, the second semiconductor layer may include a second ridge portion, the graphene may be provided between the first and second ridge portions, and the photodetection portion may further include a first electrode and a second electrode separated from the first ridge portion and electrically connected to the graphene.

The first and second ridge portions may be formed of at least one of silicon (Si), germanium (Ge), silicon-germanium, a Group III-V semiconductor, a Group II-VI semiconductor, combinations thereof, or the like.

The waveguide-integrated graphene photodetector may further include a first insulation layer provided between the first ridge portion and the graphene.

The first insulation layer may be formed of at least one of silicon oxide, aluminum oxide, silicon nitride, boron nitride, and hexagonal boron nitride.

The waveguide-integrated graphene photodetector may further include a second insulation layer between the graphene and the second ridge portion.

The second insulation layer may be formed of at least one of silicon oxide, aluminum oxide, silicon nitride, boron nitride, and hexagonal boron nitride.

The first and second insulation layers may be formed of hexagonal boron nitride.

Each of the first and second insulation layers may be formed as a single layer and/or to a thickness of about 50 nm.

The graphene may be formed roughly at the center of a surface (e.g., vertical surface) of the photodetection portion.

The graphene may be a graphene layer including one or more layers (e.g., one to six layers).

The first ridge portion may be an epitaxially grown silicon layer and the second ridge portion may be a polysilicon layer.

The first electrode may include a plurality of first finger electrodes, and the second electrode may include a plurality of second finger electrodes. The pluralities of first and second finger electrodes may extend in directions opposite to each other from the first and second electrodes. The plurality of first finger electrodes and the plurality of second finger electrodes may alternately on the graphene.

The waveguide and the photodetection portion may have corresponding rectangular vertical sections.

An oxide layer may be arranged under the first ridge portion, the graphene may extend from an upper surface of the first ridge portion to cover a side surface of the first ridge portion and the oxide layer, and a second insulation layer may be provided on the graphene between the first and second electrodes.

The second ridge portion may be formed on the second insulation layer to cover the side surface of the first ridge portion.

The waveguide and the photodetection portion may have a bottom surface portion including a protruding ridge protruding from the bottom surface.

Each of the waveguide and the photodetection portion may have a common bottom surface portion. The first ridge portion may protrude from the bottom surface portion, and the waveguide may include a protruding ridge protruding from the bottom surface portion.

The graphene may extend from an upper surface of the first ridge portion to cover a side surface and the bottom surface of the first ridge portion and a second insulation layer may be provided on the graphene between the first and second electrodes.

The second ridge portion may be formed to cover the side surface of the first ridge portion on the second insulation layer.

BRIEF DESCRIPTION OF THE DRAWINGS

Example embodiments will become apparent and more readily appreciated from the following description of the drawings in which.

DETAILED DESCRIPTION

Example embodiments will now be described more fully with reference to the accompanying drawings, in which some example embodiments are shown. In the drawings, the thicknesses of layers and regions are exaggerated for clarity. Like reference numerals in the drawings denote like elements.

Detailed illustrative embodiments are disclosed herein. However, specific structural and functional details disclosed herein are merely representative for purposes of describing example embodiments. Example embodiments may be embodied in many alternate forms and should not be construed as limited to only those set forth herein.

It should be understood, however, that there is no intent to limit this disclosure to the particular example embodiments disclosed. On the contrary, example embodiments are to cover all modifications, equivalents, and alternatives falling within the scope of the invention. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of this disclosure. As used herein, the term "and/or," includes any and all combinations of one or more of the associated listed items.

It will be understood that when an element is referred to as being "connected," or "coupled," to another element, it can be directly connected or coupled to the other element or intervening elements may be present. In contrast, when an element is referred to as being "directly connected," or "directly coupled," to another element, there are no intervening elements present. Other words used to describe the relationship between elements should be interpreted in a like fashion (e.g., "between," versus "directly between," "adjacent," versus "directly adjacent," etc.).

The terminology used herein is for the purpose of describing particular embodiments only and is not intended to be limiting. As used herein, the singular forms "a," "an," and "the," are intended to include the plural forms as well, unless the context clearly indicates otherwise. It will be further understood that the terms "comprises," "comprising," "includes," and/or "including," when used herein, specify the presence of stated features, integers, steps, operations, elements, and/or components, but do not preclude the presence or addition of one or more other features, integers, steps, operations, elements, components, and/or groups thereof.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

Figure 1:
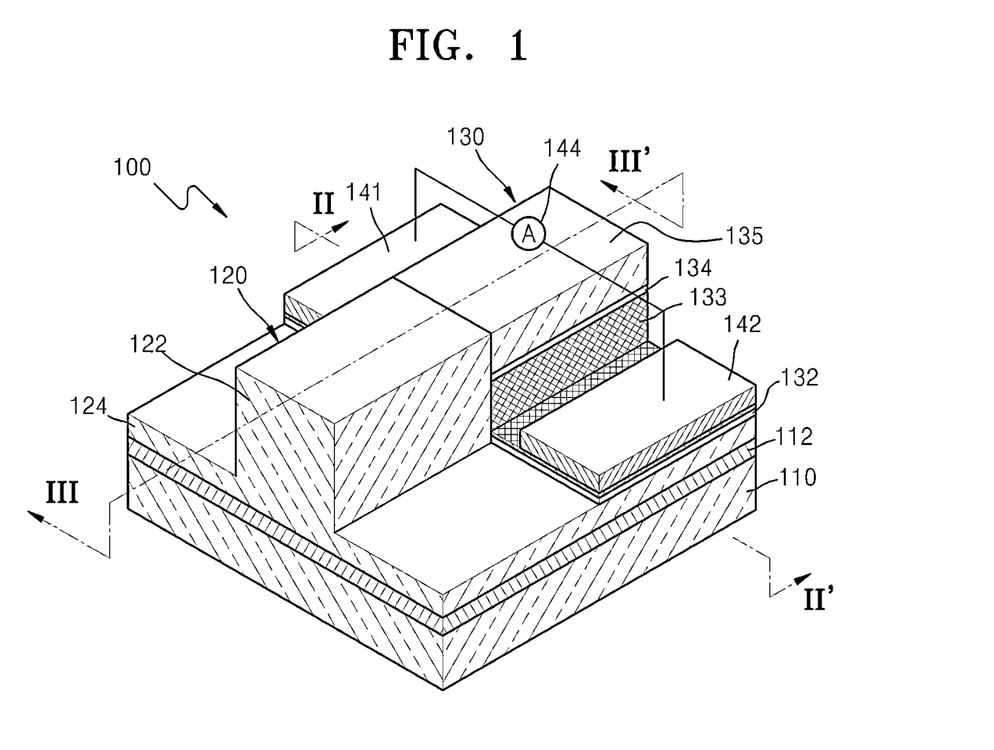
FIG. 1 is a perspective view schematically illustrating a photodetector according to an example embodiment.
Figure 2:
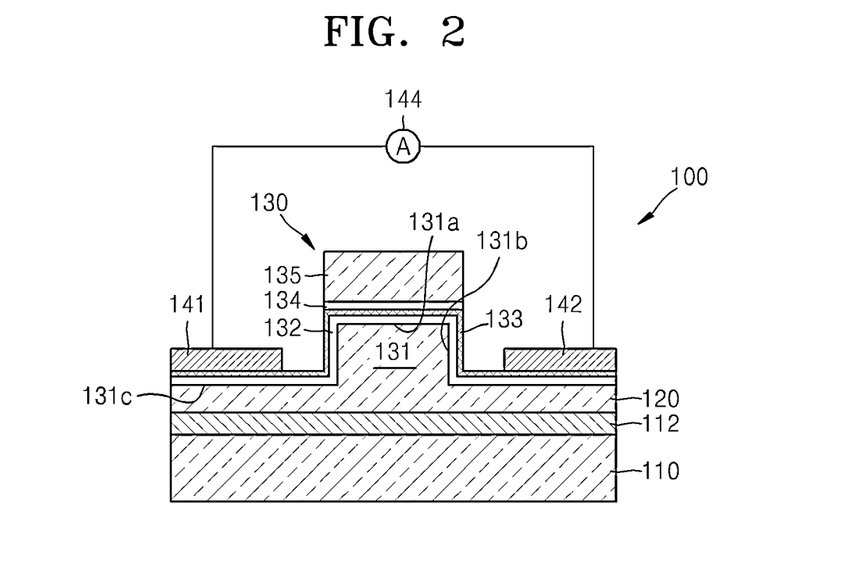
FIG. 2 is a cross-sectional view taken along line II-II' of FIG. 1.
Figure 3:
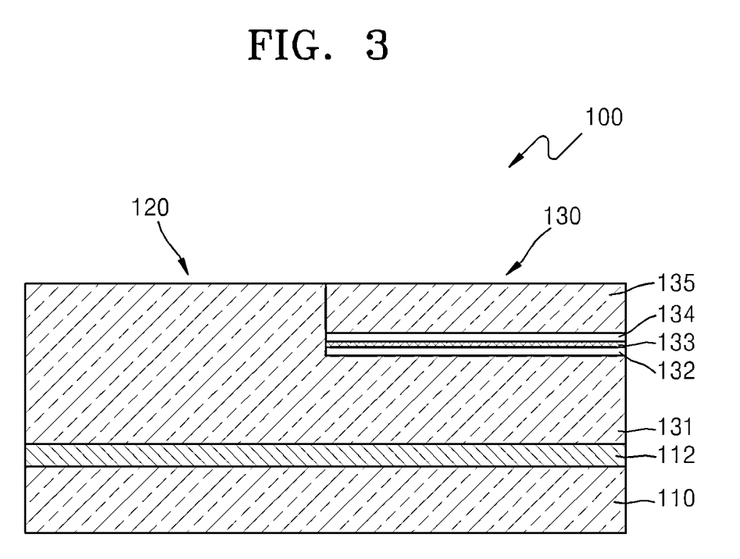
FIG. 3 is a cross-sectional view taken along line III-III' of FIG. 1.

FIG. 1 is a perspective view schematically illustrating a photodetector 100 according to an example embodiment. FIG. 2 is a cross-sectional view taken along line II-II' of FIG. 1. FIG. 3 is a cross-sectional view taken along line III-III' of FIG. 1. In at least one example embodiment, the photodetector 100 shown in FIG. 1 utilizes an evanescent-wave or evanescent-mode coupling structure.

Referring to FIGS. 1-3, an oxide layer 112 is formed on a substrate 110, a waveguide 120 is formed on the oxide layer 112, and a photodetection portion 130 is connected (e.g., directly connected) to the waveguide 120.

The waveguide 120 has a protruding ridge or portion 122 protruding or extending from an underpart 124 of the waveguide 120. The photodetection portion 130 may have a shape corresponding to the shape of the protruding ridge 122.

The photodetection portion 130 includes a first ridge portion 131 extending from the underpart 124 of the waveguide 120. The photodetection portion 130 further includes a first insulation layer 132, graphene 133, a second insulation layer 134, and a second ridge portion 135, which are sequentially stacked on and above the first ridge portion 131.

The waveguide 120, the first ridge portion 131, the second ridge portion 135, and the substrate 110 may be formed of silicon (Si), germanium (Ge), silicon-germanium, a Group III-V semiconductor, a Group II-VI semiconductor, combinations thereof, or the like.

Still referring to FIGS. 1-3, the oxide layer 112 on the substrate 110 may be a buried oxide layer. If the substrate 110, the waveguide 120, and the first ridge portion 131 are formed of silicon and the oxide layer 112 is a buried oxide layer formed of silicon oxide, then the substrate 110, the oxide layer 112, the waveguide 120, and the first ridge portion 131 may form a structure including a ridge portion formed on a silicon-on-insulator (SOI) substrate.

In the example embodiment shown in FIGS. 1-3, the photodetection portion 130 continuously extends from the waveguide 120 to contact (e.g., directly contact) the waveguide 120. The first ridge portion 131 is integrally formed with, and extends from, the waveguide 120. An upper part or portion of the photodetection portion 130 may be formed on the first ridge portion 131 after removing the corresponding portion above the first ridge portion 131 of the photodetection portion 130. The second ridge portion 135 of the photodetection portion 130 may be formed of a material having a refractive index equal or approximately equal to the refractive index of the waveguide 120 so as to suppress and/or prevent light passing through the waveguide 120 from being reflected back from a boundary surface of the photodetection portion 130 or being reflected to the outside. In one example, if the first ridge portion 131 is formed of silicon, then the second ridge portion 135 may have a refractive index that is within about 0.5 of the refractive index of the first ridge portion 131.

The first insulation layer 132 may be formed of silicon oxide, aluminum oxide, silicon nitride, boron nitride, hexagonal boron nitride, etc. The first insulation layer 132 may be formed as a single layer and/or to a thickness of about 50 nm. In the example embodiment shown in FIGS. 1-3, the first insulation layer 132 covers an upper surface 131a, a side surface 131b and a bottom surface 131c of the first ridge portion 131.

The graphene 133 may be formed by transferring graphene manufactured by a chemical vapor deposition (CVD) process onto the first insulation layer 132. In the example embodiment shown in FIGS. 1-3, the graphene 133 is formed on the first insulation layer 132. More specifically, the graphene 133 is formed on the first insulation layer 132 on each of the upper surface 131a, the side surface 131b, and the bottom surface 131c of the first ridge portion 131. The graphene 133 may be a graphene layer or graphene layer structure including at least one layer (e.g., one to six layers).

A first electrode 141 and a second electrode 142 are formed on the graphene 133 above the bottom surface 131c. The first electrode 141 and the second electrode 142 are separated or spaced apart from the side surface 131b of the first ridge portion 131. The first and second electrodes 141 and 142 may be formed of a conventional electrode material, for example, gold (Au), copper (Cu), platinum (Pt), molybdenum (Mo), palladium (Pd), etc.

An ammeter 144 may be connected to the first and second electrodes 141 and 142. The ammeter 144 is configured to measure a current flowing through the graphene 133.

The second insulation layer 134 is formed to cover the graphene 133 on the upper surface 131a of the first ridge portion 131. In this example, the second insulation layer 134 is not formed on the graphene 133 on the side surface 131b or the bottom surface 131c of the first ridge portion 131. The second insulation layer 134 may be formed of silicon oxide, aluminum oxide, silicon nitride, boron nitride, hexagonal boron nitride, etc. The second insulation layer 134 may be formed (e.g., roughly) as a single layer and/or to a thickness of about 50 nm.

If the thickness of each of the first and second insulation layers 132 and 134 is greater than about 50 nm, then a drive voltage may be increased. The first and second insulation layers 132 and 134 may be formed of at least one material layer for insulation.

Each of the first and second electrodes 141 and 142 may be separated from the side surface 131b of the first ridge portion 131 by about 100 μm to several micrometers. In at least one example embodiment, the first and second electrodes 141 and 142 are separated from the first ridge portion 131 such that transmission of light passing through the waveguide 120 is not prevented. According to at least this example embodiment, the graphene 133 connected to the first and second electrodes 141 and 142 is arranged in a light passing area and the graphene 133 is transparent in the light passing area.

The second ridge portion 135 is formed on the second insulation layer 134 to face the first ridge portion 131. The height of the second ridge portion 135 may be the same as or similar to that of the first ridge portion 131.

The first and second ridge portions 131 and 135 and the layers arranged therebetween constitute a waveguide. The graphene 133 may be positioned at the center of the light intensity distribution according to the refractive indices and heights of the first and second ridge portions 131 and 135.

Characteristically, mobility of the graphene 133 may decrease when contacting another material. However, when the first and second insulation layers 132 and 134 are formed of, for example, hexagonal boron nitride, the deterioration of mobility of the graphene 133 may be suppressed.

The second ridge portion 135 may be formed of the same or substantially the same material as the first ridge portion 131. For example, the first ridge portion 131 may be an epitaxially grown semiconductor layer and the second ridge portion 135 may be a vapor deposited semiconductor layer. In one example, the first ridge portion 131 may be a silicon epilayer and the second ridge portion 135 may be a polysilicon layer.

Example operation of the photodetector 100 will be described below in detail with reference to FIGS. 1-3.

When a given, desired or predetermined voltage is applied between the first and second electrodes 141 and 142, a Fermi level of the graphene 133 increases at a first portion of the graphene 133 connected to an electrode to which a relatively high voltage is applied, but decreases at a second portion of the graphene 133 connected to an electrode to which a relatively low voltage is applied. Accordingly, after light passes through the waveguide 120, the light is absorbed by the photodetection portion 130 while passing through the photodetection portion 130, thereby generating electrons and carriers. The generated electrons gather at the electrode having an increased Fermi level. As the amount of light increases, the amount of electrons also increases. Thus, the amount of light passing through the photodetection portion 130 may be measured from the intensity of electricity between the first and second electrodes 141 and 142 as measured by the ammeter 144.

Because the graphene 133 having relatively high light absorption is arranged at the central portion of the photodetection portion 130 having relatively high light intensity, a measurement sensitivity of light passing through the photodetection portion 130 increases. Also, because a carrier mobility of the graphene 133 is relatively high, the amount of light may be measured at relatively high speed.

Figure 4:
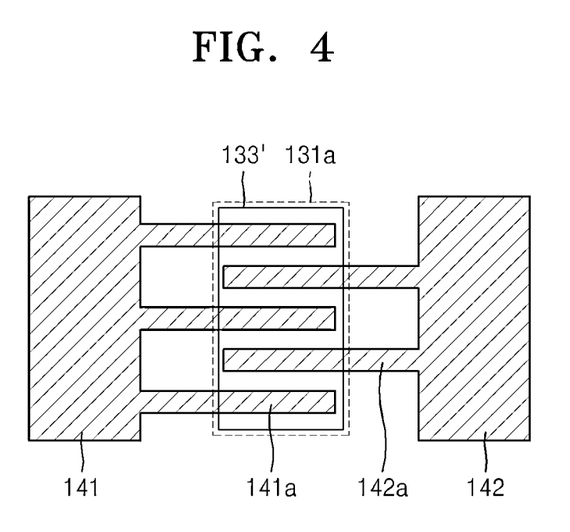
FIG. 4 is a plan view of a modified example of the photodetector 100 of FIG. 1.

FIG. 4 is a plan view of a modified example of the photodetector 100 of FIG. 1. FIG. 4 illustrates the arrangement of the graphene 133' and the electrodes 141 and 142, while omitting some constituent elements for convenience of explanation.

Referring to FIG. 4, the first electrode 141 includes a plurality of first finger electrode 141a, and the second electrode 142 includes a plurality of second finger electrodes 142a. The first and second finger electrodes 141a and 142a may be arranged alternately with regard to each other on the graphene 133' on the upper surface 131a of the first ridge portion. The first and second finger electrodes 141a and 142a are formed above the upper surface 131a of the first ridge portion 131 and extend from the first and second electrodes 141 and 142, respectively. The first and second finger electrodes 141a and 142a reduce a time for the electrons generated from the graphene 133' to move to the first and second electrodes 141 and 142, thereby increasing an operational speed of the photodetector 100.

As illustrated in FIG. 4, the graphene 133' may be formed only on the upper surface 131a of the first ridge portion to be separated from the first and second electrodes 141 and 142.

Figure 5:
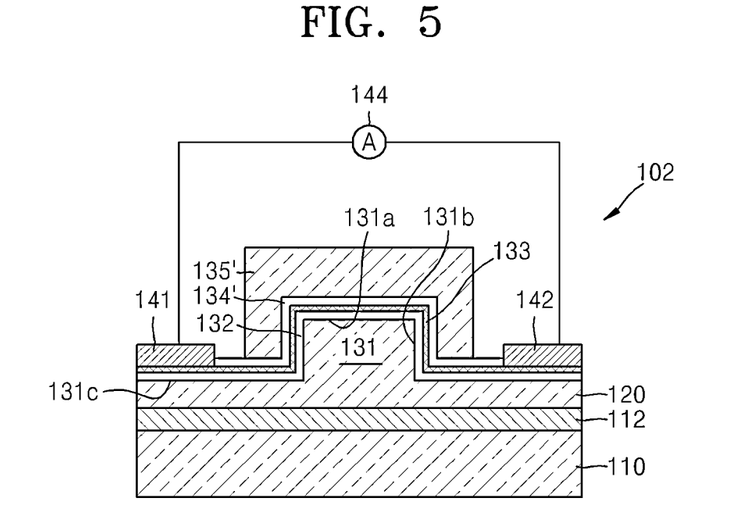
FIG. 5 is a cross-sectional view of another example embodiment of the photodetector of FIG. 1.

FIG. 5 is a cross-sectional view of another example embodiment of the photodetector 100 shown in FIG. 1. In FIG. 5, like reference numerals are used for constituent elements that are the same or substantially the same as those of the photodetector 100 of FIGS. 1 through 3, and detailed descriptions thereof will be omitted for the sake of brevity.

Referring to FIG. 5, a second insulation layer 134' covers the upper surface (e.g., the entire upper surface) of the graphene 133 between the first and second electrodes 141 and 142. In this example, the second insulation layer 134' covers the upper surface 131a, the side surface 131b and a portion of the bottom surface 131c of the first ridge portion 131.

A second ridge portion 135' is formed to cover upper and side surfaces of the second insulation layer 134'. The second ridge portion 135' also covers a portion of the bottom surface of the second insulation layer 134' as shown in FIG. 5. The thickness of the second ridge portion 135' may be uniform or substantially uniform.

In the photodetector 102 according to at least this example embodiment, a distribution of light absorbed by the graphene 133 extends to the side surface 131b because the second ridge portion 135' covers the graphene 133 on the side surface 131b of the first ridge portion 131. Thus, a light detection efficiency of the photodetector 102 may improve.

Figure 6:
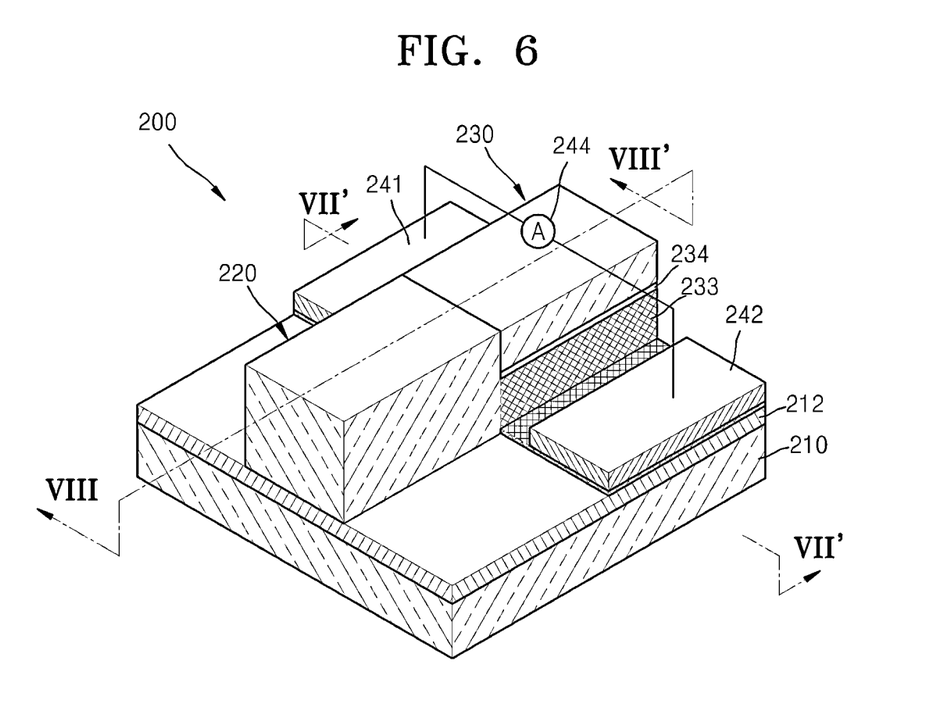
FIG. 6 is a perspective view schematically illustrating a photodetector according to another example embodiment.
Figure 7:
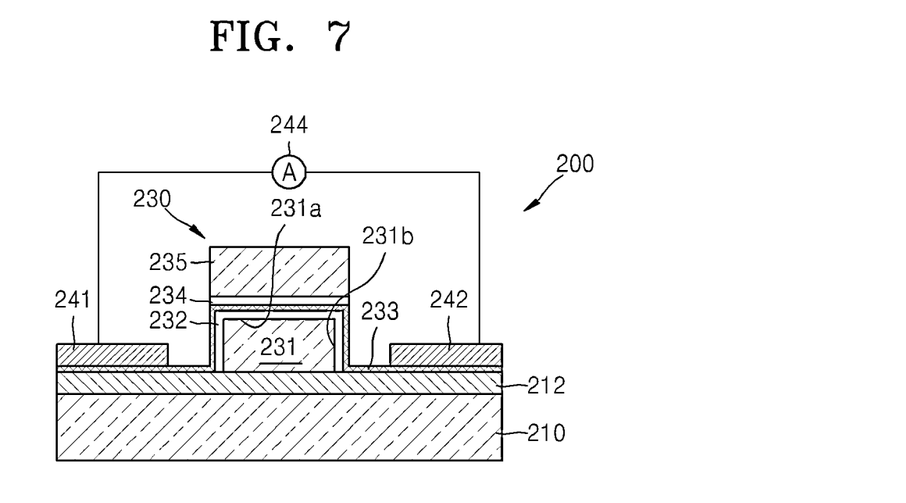
FIG. 7 is a cross-sectional view taken along line VII-VII' of FIG. 6.
Figure 8:
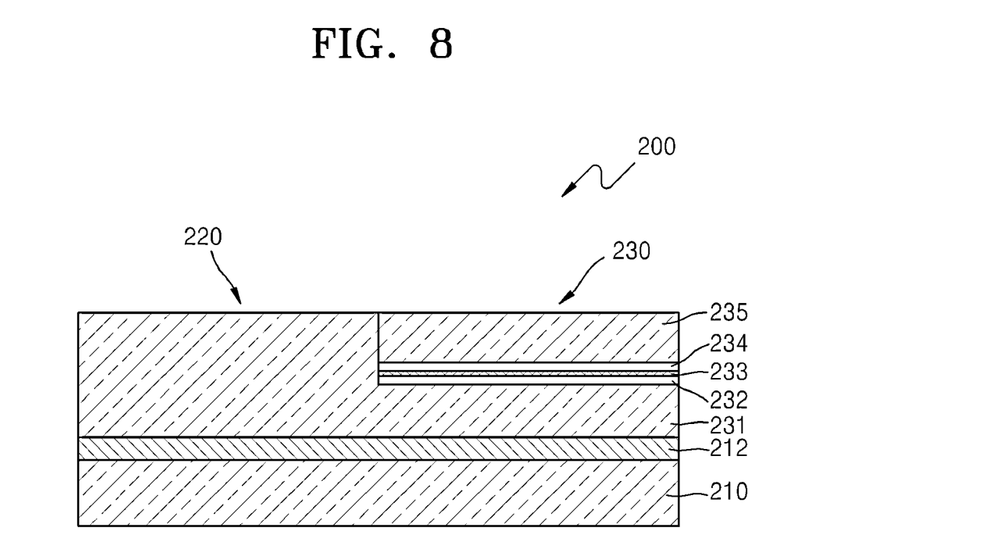
FIG. 8 is a cross-sectional view taken along line VIII-VIII' of FIG. 6

FIG. 6 is a perspective view schematically illustrating a photodetector 200 according to another example embodiment. FIG. 7 is a cross-sectional view taken along line VII-VII' of FIG. 6. FIG. 8 is a cross-sectional view taken along line VIII-VIII' of FIG. 6.

In FIGS. 6-8, like reference numerals are used for constituent elements that are the same or substantially the same as those in FIGS. 1-3, and detailed descriptions thereof will be omitted herein. In at least one example embodiment, the photodetector 200 shown in FIG. 6 utilizes a butt-coupling structure between the waveguide 220 and the photodetector portion 230.

Referring to FIGS. 6-8, an oxide layer 212 is formed on a substrate 210. A waveguide 220 and a photodetection portion 230 that is connected (e.g., directly connected) to the waveguide 220 are formed on the oxide layer 212. The waveguide 220 and the photodetection portion 230 may have the same or substantially the same vertical section (e.g., a rectangular section, although example embodiments are not limited to this shape). For example, each of the waveguide 220 and the photodetection portion 230 may have corresponding rectangular vertical sections.

The photodetection portion 230 includes a first ridge portion 231, a first insulation layer 232, graphene 233, a second insulation layer 234, and a second ridge portion 235. The first ridge portion 231 extends from an underpart of the waveguide 220. The first insulation layer 232, the graphene 233, the second insulation layer 234, and the second ridge portion 235 are sequentially stacked on the first ridge portion 231.

The waveguide 220, the first ridge portion 231, the second ridge portion 235, and the substrate 210 may be formed of silicon (Si), germanium (Ge), silicon-germanium, a Group III-V semiconductor, a Group II-VI semiconductor, combinations thereof, or the like.

The oxide layer 212 on the substrate 210 may be a buried oxide layer. If the substrate 210, the waveguide 220, and the first ridge portion 231 are formed of silicon and the oxide silicon layer 212 is a buried oxide layer formed of silicon oxide, then this structure may be obtained by patterning a silicon-on-insulator (SOI) substrate.

The photodetection portion 230 is formed to contact the waveguide 220. The first ridge portion 231 of the photodetection portion 230 extends from, and is integrally formed with, the underpart of the waveguide 220. An upperpart of the photodetection portion 230 may be formed after the corresponding portion above the first ridge portion 231 is removed. The second ridge portion 235 of the photodetection portion 230 may be formed of a material having a refractive index that is the same, substantially the same or similar to the refractive index of the waveguide 220 so as to suppress and/or prevent light passing through the waveguide 220 from being reflected back from a boundary surface of the photodetection portion 230 or being reflected to the outside. For example, if the first ridge portion 231 is formed of silicon, then the second ridge portion 235 may have a refractive index that is different from that of the first ridge portion 231 by about 0.5 or less.

The first insulation layer 232 may be formed of silicon oxide, aluminum oxide, silicon nitride, boron nitride, hexagonal boron nitride, etc. The first insulation layer 232 may be formed as a single layer and/or to a thickness of about 50 nm. In the example embodiment shown in FIGS. 6-8, the first insulation layer 232 extends from an upper surface 231a of the first ridge portion 231 to cover a side surface 231b of the first ridge portion 231 and the oxide layer 212 between the first electrode 241 and the first ridge portion 231 and between the second electrode 242 and the first ridge portion 231. The first insulation layer 232 is illustrated to cover only the upper surface 231a and the side surface 231b of the first ridge portion 231 for convenience of explanation.

The graphene 233 may be formed by transferring graphene manufactured by a chemical vapor deposition (CVD) process onto the first insulation layer 232. The graphene 233 is formed on the oxide layer 212 to cover the first insulation layer 232. The graphene 233 may be a graphene layer including at least one layer (e.g., one to six layers).

The first and second electrodes 241 and 242 are formed on the graphene 233 above the oxide layer 212. The first and second electrodes 241 and 242 are separated or spaced apart from the first ridge portion 231. The first and second electrodes 241 and 242 may be formed of a conventional electrode material, such as gold (Au), copper (Cu), platinum (Pt), molybdenum (Mo), palladium (Pd), etc.

An ammeter 244 may be connected to the first and second electrodes 241 and 242 to measure a current flowing through the graphene 233.

The second insulation layer 234 covers the graphene 233 on the upper surface 231a of the first ridge portion 231. The second insulation layer 234 may be formed of silicon oxide, aluminum oxide, silicon nitride, boron nitride, hexagonal boron nitride, etc. The second insulation layer 234 may be formed as a single layer and/or to a thickness of about 50 nm.

When the thickness of each of the first and second insulation layers 232 and 234 is greater than about 50 nm, a drive voltage of the photodetector 200 may be increased. The first and second insulation layers 232 and 234 may be formed of at least one material layer for insulation.

Each of the first and second electrodes 241 and 242 may be formed to be separated from the side surface 231b of the first ridge portion 231 by about 100 μm to several micrometers. The first and second electrodes 241 and 242 are separated from the first ridge portion 231 to a degree in order to allow (e.g., not to prevent) transmission of light passing through the waveguide 220. According to at least some example embodiments, the graphene 233 connected to the first and second electrodes 241 and 242 is arranged in a light passing area and the graphene 233 is transparent in the light passing area.

The second ridge portion 235 is formed on the second insulation layer 234 to face the first ridge portion 231. The height of the second ridge portion 235 may be the same as, substantially the same as or similar to that of the first ridge portion 231.

The first and second ridge portions 231 and 235 and the layers therebetween constitute a waveguide. The graphene 233 may be positioned at the center of the light intensity distribution according to the refractive indexes and heights of the first and second ridge portions 231 and 235.

A mobility of the graphene 233 may characteristically decrease when contacting other material. However, when the first and second insulation layers 232 and 234 are formed of hexagonal boron nitride, the deterioration of mobility of the graphene 233 may be reduced.

The second ridge portion 235 may be formed of the same or substantially the same material as the first ridge portion 231. For example, the first ridge portion 231 may be an epitaxially grown semiconductor layer and the second ridge portion 235 may be a vapor deposited semiconductor layer. For example, the first ridge portion 231 may be a silicon epilayer and the second ridge portion 235 may be a polysilicon layer.

Figure 9:
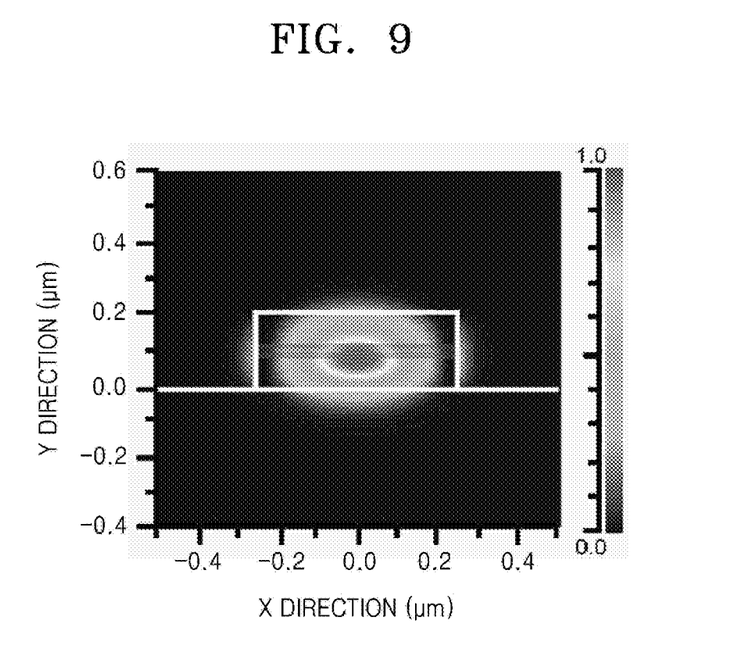
FIG. 9 is a diagram showing the intensity of light at a photodetection portion when a voltage is applied to the photodetector of FIG. 6.

FIG. 9 is a diagram showing the intensity of light at a photodetection portion when a voltage is applied to the photodetector shown in FIG. 6.

As shown in FIG. 9, the graphene 233 is located roughly at about the center on a vertical surface in a light transmission area. That is, the graphene 233 is arranged in an area where the intensity of light is relatively strong (e.g., a local maximum or the strongest).

In the photodetector 200 of FIGS. 6-8, leakage of light may be reduced as compared to the photodetector 100 of FIGS. 1-3 so that coupling efficiency of graphene and light may improve. In this regard, light detection efficiency may be improved.

Because the operation of the photodetector 200 is the same or substantially the same as that of the photodetector 100, a detailed description thereof will be omitted herein.

The first and second electrodes 241 and 242 of the photodetector 200 may include respective finger electrodes 141a and 142a as shown in FIG. 4. In at least this example embodiment, the graphene 233 may be formed only on the upper surface 231a of the first ridge portion 231.

According to at least some example embodiments, the photodetector 200 may include the second insulation layer 234 and the second ridge portion 235 as shown in FIG. 5. Because these layers and electrodes are described with regard to FIGS. 4 and 5, a detailed description thereof will be omitted for the sake of brevity.

Figure 10:
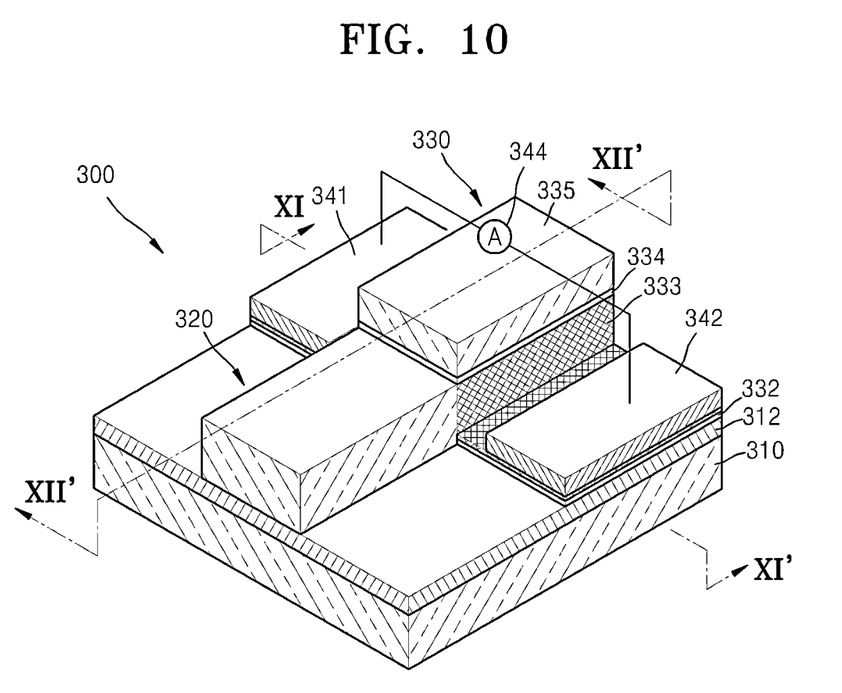
FIG. 10 is a perspective view schematically illustrating a photodetector according to another example embodiment.
Figure 11:
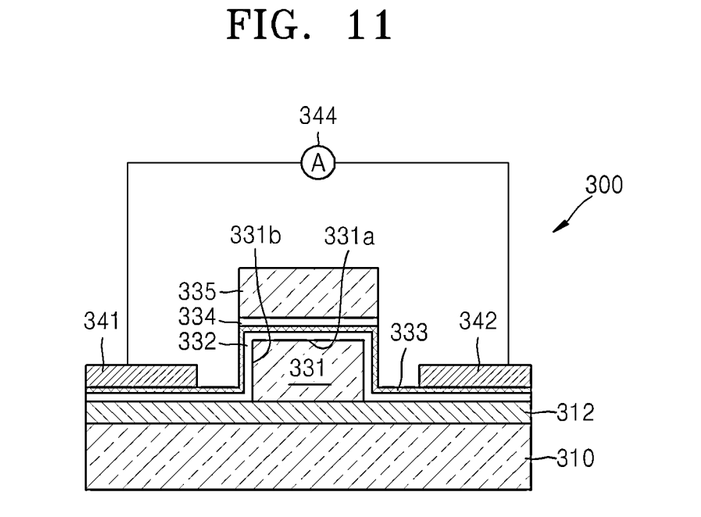
FIG. 11 is a cross-sectional view taken along line XI-XI' of FIG. 10.
Figure 12:
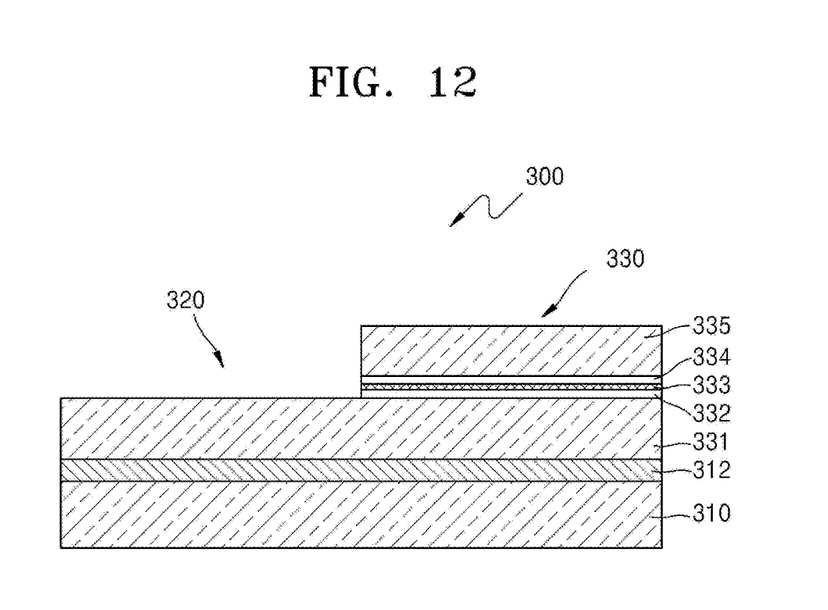
FIG. 12 is a cross-sectional view taken along line XII-XII' of FIG. 10.

FIG. 10 is a perspective view schematically illustrating a photodetector 300 according to another example embodiment. FIG. 11 is a cross-sectional view taken along line XI-XI' of FIG. 10. FIG. 12 is a cross-sectional view taken along line XII-XII' of FIG. 10.

Referring to FIGS. 10-12, an oxide layer 312 is formed on a substrate 310 and a waveguide 320 is formed on the oxide layer 312. In this example, the waveguide 320 has a rectangular vertical section, but example embodiments are not limited to this example. The waveguide 320 may have a ridge-shaped section the same as or similar to the first ridge portion 131 shown in FIG. 1.

A photodetection portion 330 is arranged in a light exit area of the waveguide 320. The photodetection portion 330 includes a first ridge portion 331, a first insulation layer 332, graphene 333, a second insulation layer 334, and a second ridge portion 335. The first ridge portion 331 extends from the waveguide 320. The first insulation layer 332, the graphene 333, the second insulation layer 334, and the second ridge portion 335 are sequentially stacked on the first ridge portion 331. The waveguide 320 and the first ridge portion 331 may have the same or substantially the same vertical section. For example, the waveguide 320 and the first ridge portion 331 may have corresponding vertical sections.

The waveguide 320, the first ridge portion 331, the second ridge portion 335, and the substrate 310 may be formed of silicon (Si), germanium (Ge), silicon-germanium, a Group III-V semiconductor, a Group II-VI semiconductor, combinations thereof, or the like.

The oxide layer 312 on the substrate 310 may be a buried oxide layer. If the substrate 310, the waveguide 320, and the first ridge portion 331 are formed of silicon and the oxide silicon layer 312 is a buried oxide layer formed of silicon oxide, then this structure may be obtained by patterning a silicon-on-insulator (SOI) substrate.

The first insulation layer 332 may be formed of silicon oxide, aluminum oxide, silicon nitride, boron nitride, hexagonal boron nitride, etc. The first insulation layer 332 may be formed as a single layer and/or to a thickness of about 50 nm. The first insulation layer 332 extends from an upper surface 331a of the first ridge portion 331 to cover a side surface 331b of the first ridge portion 331. The first insulation layer 332 further extends to cover the oxide layer 312 between the first ridge portion 331 and first and second electrodes 341 and 342. In the example embodiment shown in FIGS. 10-12, the first insulation layer 332 is also formed between the oxide layer 312 and the first and second electrodes 341 and 342, such that the first insulation layer 332 covers the upper surface 331a and side surface 331b of the first ridge portion 331 as well as the upper surface of the oxide layer 312 not covered by the first ridge portion 331.

The graphene 333 may be formed by transferring graphene manufactured by a chemical vapor deposition (CVD) process onto the first insulation layer 332. The graphene 333 is formed on the oxide layer 312 to cover (e.g., the entire upper surface of) the first insulation layer 332. The graphene 333 may be a graphene layer including at least one layer (e.g., one to six layers).

The first and second electrodes 341 and 342 are formed on the graphene 333 to be separated or spaced apart from the first ridge portion 331. The first and second electrodes 341 and 342 may be formed of a conventional electrode material, such as gold (Au), copper (Cu), platinum (Pt), molybdenum (Mo), palladium (Pd), etc.

An ammeter 344 may be connected to the first and second electrodes 341 and 342 to measure a current flowing through the graphene 333.

The second insulation layer 334 covers the graphene 333 on the upper surface 331a of the first ridge portion 331. The second insulation layer 334 may be formed of silicon oxide, aluminum oxide, silicon nitride, boron nitride, hexagonal boron nitride, etc. The second insulation layer 334 may be formed as a single layer and/or to a thickness of about 50 nm.

When the thickness of each of the first and second insulation layers 332 and 334 is greater than about 50 nm, a drive voltage of the photodetector 300 may be increased. The first and second insulation layers 332 and 334 may be formed of at least one material layer for insulation.

Each of the first and second electrodes 341 and 342 may be formed to be separated from the side surface 331b of the first ridge portion 331 by about 100 μm to several micrometers. The first and second electrodes 341 and 342 are separated from the first ridge portion 331 to a degree in order to allow (or not to prevent) transmission of light passing through the waveguide 320. According to at least some example embodiments, the graphene 333 connected to the first and second electrodes 341 and 342 is arranged in a light passing area and the graphene 333 is transparent in the light passing area.

The second ridge portion 335 is formed on the second insulation layer 334 to face the first ridge portion 331. The height of the second ridge portion 335 may be the same as, substantially the same as or similar to that of the first ridge portion 331.

The first and second ridge portions 331 and 335 and the layers therebetween constitute a waveguide. The first and second ridge portions 331 and 335 may be formed to have the same or similar heights such that the graphene 333 may be located (e.g., roughly) at about the center of a vertical surface of the photodetection portion 330. The graphene 333 may be adjusted to be arranged at about the center of the light intensity distribution according to the refractive indexes and heights of the first and second ridge portions 331 and 335.

A mobility of the graphene 333 may characteristically decrease when contacting another material. However, when the first and second insulation layers 332 and 334 are formed of hexagonal boron nitride, the deterioration of mobility of the graphene 333 may be reduced.

The second ridge portion 335 may be formed of a material having a refractive index that is the same as, substantially the same as or similar to the refractive index of the first ridge portion 331. If the first ridge portion 331 is formed of silicon, then the second ridge portion 335 may have a refractive index that is different from that of the first ridge portion 331 by about 0.5 or less. For example, the first ridge portion 331 may be an epitaxially grown semiconductor layer and the second ridge portion 335 may be a vapor deposited semiconductor layer. In another example, the first ridge portion 331 may be a silicon epilayer and the second ridge portion 335 may be a polysilicon layer.

Figure 13:
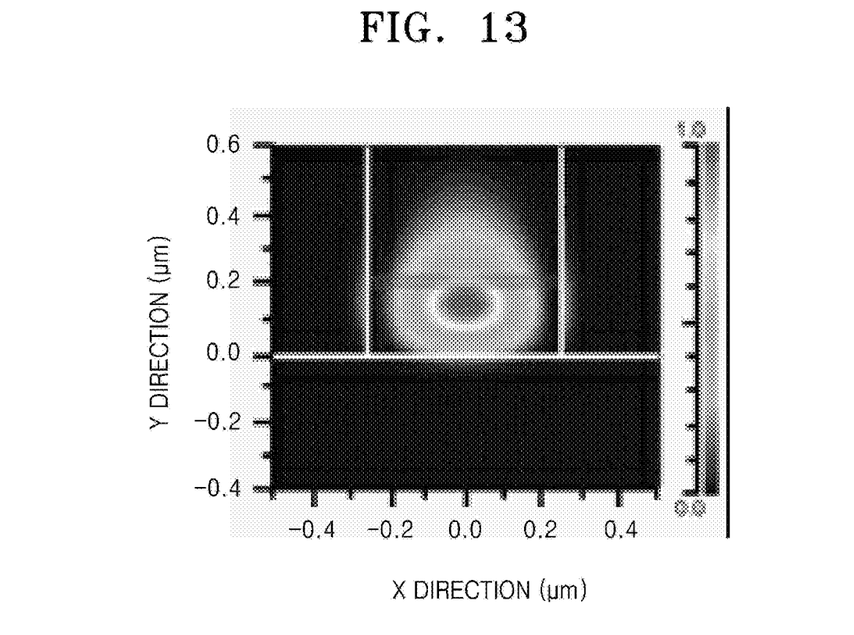
FIG. 13 is a diagram showing the intensity of light at a photodetection portion when a voltage is applied to the photodetector of FIG. 10.

FIG. 13 is a diagram showing example intensity of light at the photodetection portion 330 when a voltage is applied to the photodetector 300 of FIG. 10.

As shown in FIG. 13, the graphene 333 is located at about the center portion on a vertical surface in a light transmission area. Also, the graphene 233 is arranged relatively close to an area where the intensity of light is at a maximum (e.g., local maximum or the strongest).

Example operation of the photodetector 300 according to another example embodiment will be described below in detail with reference to FIGS. 10-13.

When a given desired or predetermined voltage is applied between the first and second electrodes 341 and 342, a Fermi level of the graphene 333 increases at a first portion of the graphene 333 connected to an electrode to which a relatively high voltage is applied and decreases at second portion of the graphene 333 connected to an electrode to which a relatively low voltage is applied. Accordingly, after light passes through the waveguide 320, the light passes through the photodetection portion 330. In doing so, the light is partially branched into the second ridge portion 335. When passing through the photodetection portion 330, the light is absorbed by the photodetection portion 330, thereby generating electrons and carriers. The generated electrons are gathered at the electrode having an increased Fermi level.

As the amount of light increases, the amount of electrons increases as well. Thus, the amount of light passing through the photodetection portion 330 may be measured from the intensity of electricity between the first and second electrodes 341 and 342 measured by the ammeter 344.

A measurement sensitivity of light passing through the photodetection portion 330 increases because the graphene 333 having a relatively high light absorption is arranged at about the central portion of the photodetection portion 330 having a relatively high light intensity. Also, the amount of light may be measured at relatively high speed because a carrier mobility of the graphene 333 is relatively high.

In the meantime, the first and second electrodes 341 and 342 may have respective first and second finger electrodes 141a and 142a as shown in FIG. 4, but a detailed description thereof will be omitted herein. Also, the photodetector 300 may include the second insulation layer 134' and the second ridge portion 135' of FIG. 5. Because these layers and electrodes are described with regard to FIGS. 4 and 5, a detailed description thereof will be omitted for the sake of brevity.

Also, the waveguide 320 and the photodetection portion 330 of the photodetector 300 have a rectangular vertical section, but example embodiments are not limited thereto. For example, the waveguide 320 and the photodetection portion 330 of the photodetector 300 may have a section including a protruding ridge like the waveguide 120 and the photodetection portion 130 of the photodetector 100. In this example, the first insulation layer 332 may be formed to cover a bottom surface of the first ridge portion and the first and second electrodes 341 and 342 may be formed on the bottom surface of the first ridge portion. Detailed descriptions of other elements are omitted herein.

In waveguide-integrated graphene photodetectors according to at least some example embodiments, a detection speed may be improved because electrons generated when light passing through the waveguide passes through the photodetector are detected through the graphene that is formed at the central portion of the photodetector. Also, the graphene in the photodetection portion increases light absorption rate so that sensitivity of the photodetector may improve.

It should be understood that the example embodiments described therein should be considered in a descriptive sense only and not for purposes of limitation. Descriptions of features or aspects within each embodiment should typically be considered as available for other similar features or aspects in other embodiments.

What is claimed is:
1. A photodetector comprising:
a waveguide on a substrate; and a photodetection portion configured to receive light incident on the waveguide, the photodetection portion including,
    a first semiconductor layer contacting the waveguide,
    graphene on the first semiconductor layer, and
    a second semiconductor layer on the graphene.

2. The photodetector of claim 1, wherein the photodetection portion is connected to the waveguide, the first semiconductor layer has a first ridge portion extending from a lower portion of the waveguide, the graphene is formed on at least an upper surface of the first ridge portion, the second semiconductor layer includes a second ridge portion formed on the graphene, the second ridge portion contacting an upper portion of the waveguide, and wherein the photodetector further includes,
    a first electrode and a second electrode separated from the first ridge portion and electrically connected to the graphene.

3. The photodetector of claim 2, wherein the first electrode includes a plurality of first finger electrodes and the second electrode includes a plurality of second finger electrodes, the plurality of first finger electrodes and the plurality of second finger electrodes extending in directions opposite to each other, and the plurality of first finger electrodes and the plurality of second finger electrodes being alternately arranged on the graphene.

4. The photodetector of claim 2, wherein an oxide layer is under the first ridge portion, the graphene covers the upper surface of the first ridge portion, a side surface of the first ridge portion, and the oxide layer, and wherein a second insulation layer is on an upper surface of the graphene between the first and second electrodes.

5. The photodetector of claim 4, wherein the second ridge portion is on the second insulation layer and covers the side surface of the first ridge portion on the second insulation layer.

6. The photodetector of claim 2, wherein the waveguide and the photodetection portion have a common bottom surface portion, and wherein the first ridge portion protrudes from the bottom surface portion, and the waveguide includes a protruding ridge protruding from the bottom surface portion.

7. The photodetector of claim 6, wherein the graphene covers the upper, side and bottom surfaces of the first ridge portion, and wherein a second insulation layer is on an upper surface of the graphene between the first and second electrodes.

8. The photodetector of claim 7, wherein the second ridge portion covers the side surface of the first ridge portion on the second insulation layer.

9. The photodetector of claim 1, wherein the first and second semiconductor layers are formed of at least one of silicon (Si), germanium (Ge), silicon-germanium, a Group III-V semiconductor, and a Group II-VI semiconductor.

10. The photodetector of claim 1, further comprising:
    a first insulation layer between the first semiconductor layer and the graphene.

11. The photodetector of claim 10, wherein the first insulation layer is formed of at least one of silicon oxide, aluminum oxide, silicon nitride, boron nitride, and hexagonal boron nitride.

12. The photodetector of claim 10, further comprising:
    a second insulation layer between the graphene and the second semiconductor layer.

13. The photodetector of claim 12, wherein the second insulation layer is formed of at least one of silicon oxide, aluminum oxide, silicon nitride, boron nitride, and hexagonal boron nitride.

14. The photodetector of claim 13, wherein the first and second insulation layers are formed of hexagonal boron nitride.

15. The photodetector of claim 13, wherein each of the first and second insulation layers is formed at least one of as a single layer and to a thickness of about 50 nm.

16. The photodetector of claim 1, wherein the graphene is at about a center portion of a surface of the photodetection portion.

17. The photodetector of claim 1, wherein the graphene includes a plurality of graphene layers.

18. The photodetector of claim 1, wherein the first semiconductor layer is an epitaxially grown silicon layer and the second semiconductor layer is a polysilicon layer.

19. The photodetector of claim 1, wherein the waveguide and the photodetection portion have corresponding rectangular vertical sections.

20. The photodetector of claim 1, wherein the photodetection portion is connected to the waveguide, the first semiconductor layer includes a first ridge portion extended from the waveguide, the second semiconductor layer includes a second ridge portion, the graphene is provided between the first and second ridge portions, and the photodetection portion further includes,
    a first electrode and a second electrode separated from the first ridge portion and electrically connected to the graphene.

21. The photodetector of claim 20, wherein the first and second ridge portions are formed of at least one of silicon (Si), germanium (Ge), silicon-germanium, a Group III-V semiconductor, and a Group II-VI semiconductor.

22. The photodetector of claim 20, further comprising:
    a first insulation layer between the first ridge portion and the graphene.

23. The photodetector of claim 22, wherein the first insulation layer is formed of at least one of silicon oxide, aluminum oxide, silicon nitride, boron nitride, and hexagonal boron nitride.

24. The photodetector of claim 22, further comprising:
    a second insulation layer between the graphene and the second ridge portion.

25. The photodetector of claim 24, wherein the second insulation layer is formed of at least one of silicon oxide, aluminum oxide, silicon nitride, boron nitride, and hexagonal boron nitride.

26. The photodetector of claim 24, wherein the first and second insulation layers are formed of hexagonal boron nitride.

27. The photodetector of claim 24, wherein each of the first and second insulation layers are formed at least one of as a single layer and to a thickness of about 50 nm.

28. The photodetector of claim 20, wherein the graphene is at about a center portion of a surface of the photodetection portion.

29. The photodetector of claim 20, wherein the graphene includes a plurality of graphene layers.

30. The photodetector of claim 20, wherein the first ridge portion is an epitaxially grown silicon layer and the second ridge portion is a polysilicon layer.

31. The photodetector of claim 20, wherein the first electrode includes a plurality of first finger electrodes and the second electrode includes a plurality of second finger electrodes, the plurality of first finger electrodes and the plurality of second finger electrodes extending in directions opposite to each other, and the plurality of first finger electrodes and the plurality of second finger electrodes being alternately arranged on the graphene.

32. The photodetector of claim 20, wherein the waveguide and the first ridge portion have corresponding rectangular vertical sections.

33. The photodetector of claim 32, wherein an oxide layer is under the first ridge portion, the graphene covers an upper surface of the first ridge portion, a side surface of the first ridge portion, and the oxide layer, and wherein a second insulation layer is on the graphene between the first and second electrodes.

34. The photodetector of claim 33, wherein the second ridge portion covers the side surface of the first ridge portion on the second insulation layer.

35. The photodetector of claim 20, wherein the waveguide and the photodetection portion have a common bottom surface portion, the first ridge portion protruding from the bottom surface portion, and wherein the waveguide includes a protruding ridge protruding from the bottom surface portion.

36. The photodetector of claim 35, wherein the graphene covers upper, side and bottom surfaces of the first ridge portion, and a second insulation layer is on the graphene between the first and second electrodes.

37. The photodetector of claim 36, wherein the second ridge portion covers the side surface of the first ridge portion on the second insulation layer.

\* \* \* \* \*